US012785577B2

(12) United States Patent
Jin et al.

(10) Patent No.: US 12,785,577 B2
(45) Date of Patent: Nov. 3, 2026

(54) ADAPTIVE SLEW RATE DETECTION FOR A SYNCHRONOUS RECTIFIER OF A SYNCHRONOUS FLYBACK CONVERTER

(71) Applicants: NEXPERIA B.V., Nijmegen (NL); Nexperia Technology (Shanghai) Ltd., Shanghai (CN)

(72) Inventors: GaoXian Jin, Shanghai (CN); Minhua Wang, Shanghai (CN); Long Huang, Shenzhen (CN); Wanhua Zeng, Shenzhen (CN); Minyi Xie, Shenzhen (CN); Feifei Shen, Shenzhen (CN)

(73) Assignees: NEXPERIA B.V., Nijmegen (NL); Nexperia Technology (Shanghai) Ltd., Shanghai (CN)

( * ) Notice: Subject to any disclaimer, the term of this patent is extended or adjusted under 35 U.S.C. 154(b) by 175 days.

(21) Appl. No.: 18/925,171

(22) Filed: Oct. 24, 2024

(65) Prior Publication Data

US 2025/0132687 A1 Apr. 24, 2025

(30) Foreign Application Priority Data

Oct. 24, 2023 (EP) .................................... 23205527

(51) Int. Cl.

| | |
|---|---|
| ***H02M 3/335*** | (2006.01) |
| ***H02M 1/00*** | (2006.01) |
| ***H02M 1/32*** | (2007.01) |
| *H03K 17/30* | (2006.01) |

(52) U.S. Cl.

CPC ..... *H02M 3/33592* (2013.01); *H02M 1/0029* (2021.05); *H02M 1/32* (2013.01); *H02M 1/0032* (2021.05); *H03K 17/302* (2013.01)

(58) Field of Classification Search

CPC ........... H02M 3/33592; H02M 1/0029; H02M 1/0032; H02M 1/08; H02M 1/32; Y02B 70/10; H03K 17/302; H03K 17/162

See application file for complete search history.

(56) References Cited

U.S. PATENT DOCUMENTS

| | | | | |
|---|---|---|---|---|
| 10,432,104 B2 | 10/2019 | Li et al. | | |
| 11,621,646 B2 | 4/2023 | Zong et al. | | |
| 2021/0067026 A1* | 3/2021 | Tsai | ........................ | H02M 1/08 |

FOREIGN PATENT DOCUMENTS

| | | |
|---|---|---|
| CN | 112865541 B | 3/2022 |

OTHER PUBLICATIONS

Extended European Search Report for corresponding European application 23205527.7 8 pages, dated Mar. 27, 2024.

* cited by examiner

*Primary Examiner* — Crystal L Hammond
*Assistant Examiner* — Jonathan Walter Soileau
(74) *Attorney, Agent, or Firm* — Ruggiero McAllister & McMahon LLC

(57) ABSTRACT

A controller of a synchronous rectifier of a synchronous flyback converter is presented. The synchronous rectifier includes a switch that is switchable by the controller. The controller includes an adaptive slew rate detection circuit that is configured to add a current to a base slew rate current depending on an off-time of the switch to obtain a slew rate current. The slew rate current determines a slew rate setting voltage. The controller is configured to turn on the switch of the synchronous rectifier depending on the slew rate setting voltage.

19 Claims, 11 Drawing Sheets

300

400

ADAPTIVE SLEW RATE DETECTION FOR A SYNCHRONOUS RECTIFIER OF A SYNCHRONOUS FLYBACK CONVERTER

CROSS-REFERENCE TO RELATED APPLICATIONS

This application claims priority under 35 U.S.C. § 119 to European patent application EP 23205527.7, filed Oct. 24, 2023, the entire disclosure of which is incorporated herein by reference.

BACKGROUND OF THE DISCLOSURE

1. Field of the Disclosure

The present disclosure relates to a controller of a synchronous rectifier, a synchronous flyback converter including such controller, and a switching power supply including such synchronous flyback converter.

2. Description of Related Art

FIG. 1 and FIG. 2 show two examples of known rectifying schemes that can be used in a secondary side of isolated switching converters. FIG. 1 shows a rectifying scheme 100 for non-synchronous rectifying using a diode D and FIG. 2 shows a rectifying scheme 200 for synchronous rectifying using a synchronous rectifier SR, e.g., an n-channel metal-oxide-semiconductor field-effect transistor (N-MOSFET) or more generally any synchronous rectifier FET in combination with a body diode D2. The rectifying schemes 100, 200 typically include a transformer T1, with a primary switch S1 driving the primary winding of the transformer T1. The diode D and the synchronous rectifier SR are connected to the secondary winding of the transformer T1. Further shown are a capacitor C and indicators for an input voltage Vin, an output voltage Vout, a secondary voltage Vse, a forward voltage VF, a forward current IF, a source S at SR, a drain D at SR, and a control signal G at SR.

In FIG. 3, example power dissipation-current characteristics 300 for the diode D of FIG. 1 and the synchronous rectifier SR of FIG. 2 are plotted. Compared to the relatively fixed forward voltage drop of the diode, the synchronous rectifier FET's voltage drop is proportional to the current and turn-on resistance. A synchronous rectifier solution can, therefore achieve better efficiency and thermal performance than a conventional diode solution, which is, e.g., an important requirement for high-power adapter designs.

Synchronous rectifiers have thus found increasingly wide applications in devices sensitive to power efficiency, such as laptop adapters, wireless equipment, LCD power management modules, power over Ethernet, and so on.

The synchronous rectifying scheme, such as shown in FIG. 2, can be used in a synchronous flyback converter. A flyback converter is a type of switching power supply topology commonly used for applications such as power adapters, battery chargers, and voltage converters, and operates by storing energy in a transformer during the switch-on time and then releasing it to the output during the switch-off time.

FIG. 4 schematically shows example waveforms 400 of a drain-source voltage VDS and a control signal G of a synchronous rectifier, e.g., the synchronous rectifier SR of FIG. 2, in a synchronous flyback converter under discontinuous current mode (DCM). The drain-source voltage VDS can also be referred to as a switch voltage or a voltage across the synchronous rectifier SR. Normally, when a primary switch S1 coupled to the primary winding of transformer T1 is turned on, the input voltage Vin, as shown in FIG. 2, is configured to the dotted terminal of the primary winding. Then, the dotted terminal of the secondary winding is positive, and the drain-source voltage VDS is positive too. As a result, the body diode D2 of the synchronous rectifier SR is reverse-biased. At time t0, the primary switch S1 is turned off, and energy stored in the primary winding is transferred to the secondary winding of the transformer T1. A current flowing through the secondary winding from the dotted terminal gets the body diode D2 forward-biased. As a result, the drain-source voltage VDS=−VF decreases to a negative value, wherein VF is a forward voltage drop of the body diode D2 of the synchronous rectifier SR. In some applications, on and off of the synchronous rectifier SR can be determined by a comparison result of the drain-source voltage VDS with a preset threshold, wherein the comparison result is reflected by the control signal G. In this example, when the drain-source voltage VDS of the synchronous rectifier SR decreases to a first preset value, e.g., −100 mV, the synchronous rectifier SR is turned on by the secondary control signal G, and when the drain-source voltage VDS of the synchronous rectifier SR increases to a second preset value, e.g., 0V, the synchronous rectifier is turned off by the secondary control signal G. As can be seen from FIG. 4, the synchronous rectifier SR is supposed to be turned off after time t1 when the drain-source voltage VDS increases to 0V. But when the flyback converter works under DCM in real application, the drain-source voltage VDS can ring (i.e., experience oscillatory behavior) after the synchronous rectifier SR is turned off and, in this example, rings down to −100 mV at time t2. As a result, the synchronous rectifier SR is unexpectedly turned on (mis-triggered) by the secondary control signal G at time t2.

SUMMARY OF THE DISCLOSURE

A summary of aspects of certain examples disclosed herein is set forth below. It should be understood that these aspects are presented merely to provide the reader with a brief summary of certain embodiments and that these aspects are not intended to limit the scope of this disclosure. Indeed, this disclosure can encompass a variety of aspects and/or a combination of aspects that cannot be set forth.

The present disclosure aims to overcome the drawbacks identified in the background section. In particular, the present disclosure aims to prevent miss-triggering as a result of DCM ringing in a synchronous rectifier at a second side of a transformer in a synchronous flyback converter.

The present disclosure presents a solution to prevent a synchronous rectifier from mis-triggering during DCM ringing. Advantageously, the synchronous rectifier of the present disclosure can be conducted under all load conditions (i.e., heavy load and light load).

According to an aspect of the present disclosure, a controller of a synchronous rectifier is presented. The synchronous rectifier can include a switch that is switchable by the controller. The controller can include an adaptive slew rate detection circuit. The adaptive slew rate detection circuit can be configured to add a current to a base slew rate current depending on an off-time of the switch to obtain a slew rate current. The slew rate current can determine a slew rate setting voltage. The controller can be configured to turn on the switch depending on the slew rate setting voltage.

In an embodiment, the controller can further include a gate state detection circuit configured to detect an off-state of the switch. The adaptive slew rate detection circuit can be configured to add the current to the base slew rate current when the switch is in the off-state.

In an embodiment, the adaptive slew rate detection circuit can include a plurality of current selectors. Each current selector can be configured to detect different off-times of the switch based on a voltage generated as a result of charging characteristics of a capacitor during the off-time of the switch. Each current selector can be configured to include a different current source to the adaptive slew rate detection circuit to add a respective current to the base slew rate current.

In an embodiment, each current selector can be configured to switch a current switch to include the respective current source into the slew rate detection circuit.

In another embodiment, the adaptive slew rate detection circuit can include a current selector. The current selector can be configured to increasingly add the current depending on the off-time of the switch based on a voltage generated as a result of charging characteristics of a capacitor during the off-time of the switch.

In an embodiment, the synchronous rectifier can be configured to operate in a discontinuous current mode.

In an embodiment, the switch can include a field-effect transistor.

According to an aspect of the present disclosure, a synchronous flyback converter is presented. The synchronous flyback converter can include a transformer. The synchronous flyback converter can include a primary switch coupled to a primary winding of the transformer. The synchronous flyback converter can include a synchronous rectifier coupled to a secondary winding of the transformer. The synchronous rectifier can include a secondary switch that is switchable under control of a controller having one or more of the above-described features.

According to an aspect of the present disclosure, a switching power supply is presented. The switching power supply can include a synchronous flyback converter having one or more of the above-described features.

BRIEF DESCRIPTION OF THE DRAWINGS

Embodiments of the present disclosure will now be described, by way of example only, with reference to the accompanying schematic drawings in which corresponding reference symbols indicate corresponding parts.

Figure 1:
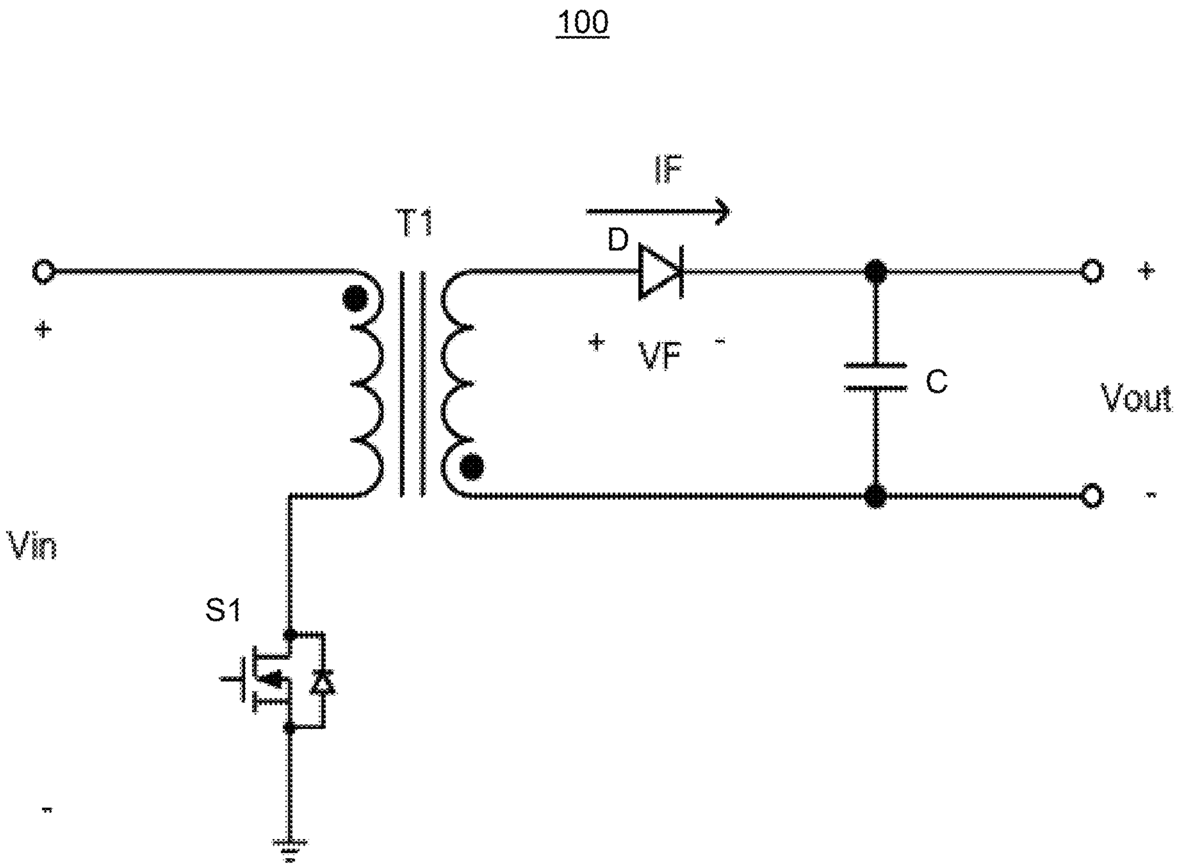
FIG.1 (Prior Art)
FIG. 1 shows a known rectifying scheme for non-synchronous rectifying using a diode D.

The figures are intended for illustrative purposes only and do not serve as a restriction of the scope of the protection as laid down by the claims.

DETAILED DESCRIPTION

It will be readily understood that the components of the embodiments, as generally described herein and illustrated in the appended figures, could be arranged and designed in a wide variety of different configurations. Thus, the following more detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the present disclosure is, therefore, indicated by the appended claims rather than by this detailed description. All changes that come within the meaning and range of equivalency of the claims are to be embraced within their scope.

Reference throughout this specification to features, advantages, or similar language does not imply that all of the features and advantages that can be realized with the present disclosure should be or are in any single example of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification can, but do not necessarily, refer to the same example.

Furthermore, the described features, advantages, and characteristics of the present disclosure can be combined in any suitable manner in one or more embodiments. One skilled in the relevant art will recognize, in light of the description herein, that the present disclosure can be practiced without one or more of the specific features or advantages of a particular embodiment. In other instances, additional features and advantages can be recognized in certain embodiments that cannot be present in all embodiments of the present disclosure. Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification can but do not necessarily all refer to the same embodiment.

In the following example embodiments, numerous specific details are provided, such as examples of circuits, components, and methods, to provide a thorough understanding of various embodiments of the technology. Persons of ordinary skill in the art will recognize, however, that the technology can be practiced without one or more of the specific details. In other instances, well-known details are not shown or described to avoid obscuring aspects of the technology.

In the context of flyback topology and power electronics, the term "slew rate" typically refers to the rate of change of voltage or current in the circuit.

The present disclosure presents an adaptive slew rate detection method for synchronous rectification, where the slew rate can be set differently based on the length of the switch-off time of the synchronous rectifier at the second side of a transformer. The shorter the off time, the higher the slew rate, which can advantageously prevent the switch (i.e., of the synchronous rectifier) from being mis-triggered during a DCM ringing process. At the same time, the solution of the present disclosure ensures more reliable conduction of switch tube under light load conditions and thus improves light load efficiency.

Figure 2:
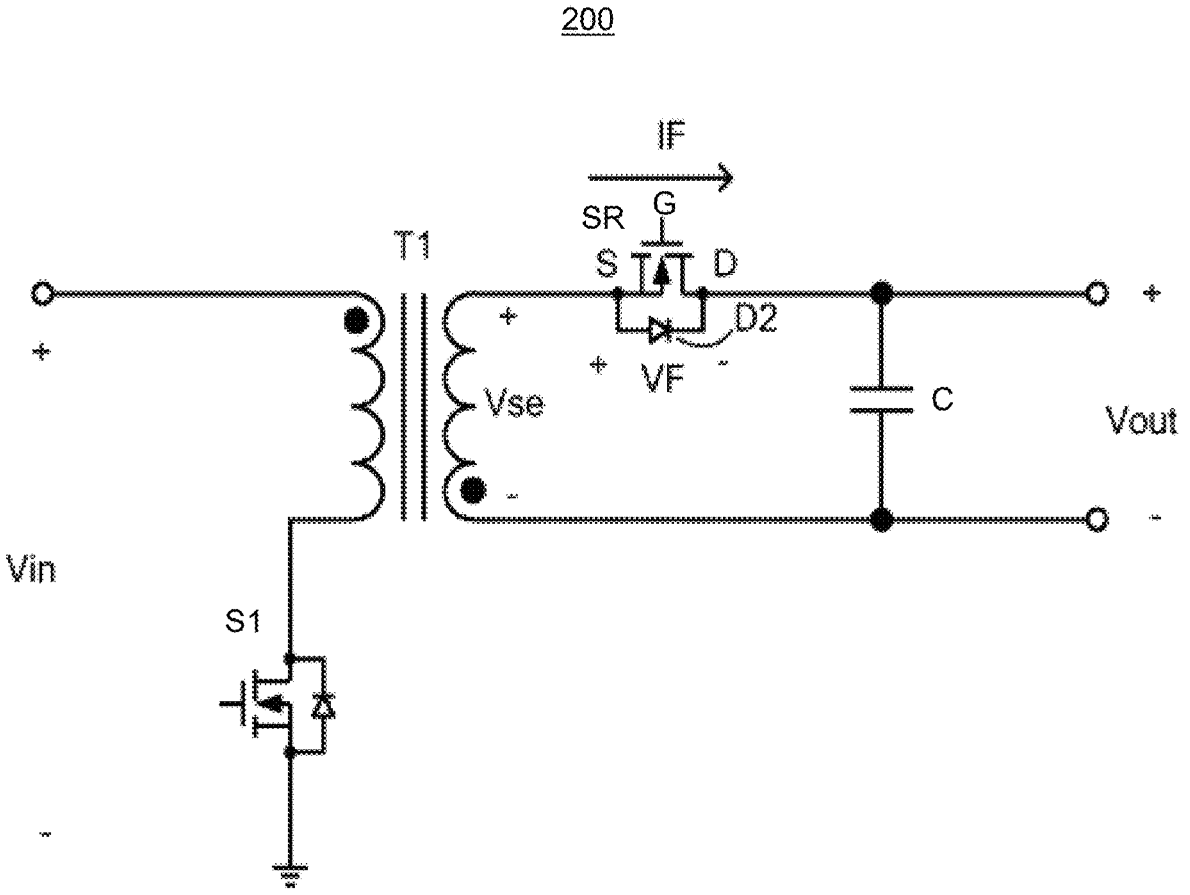
FIG.2 (Prior Art)
FIG. 2 shows a known rectifying scheme for synchronous rectifying using a synchronous rectifier.
Figure 3:
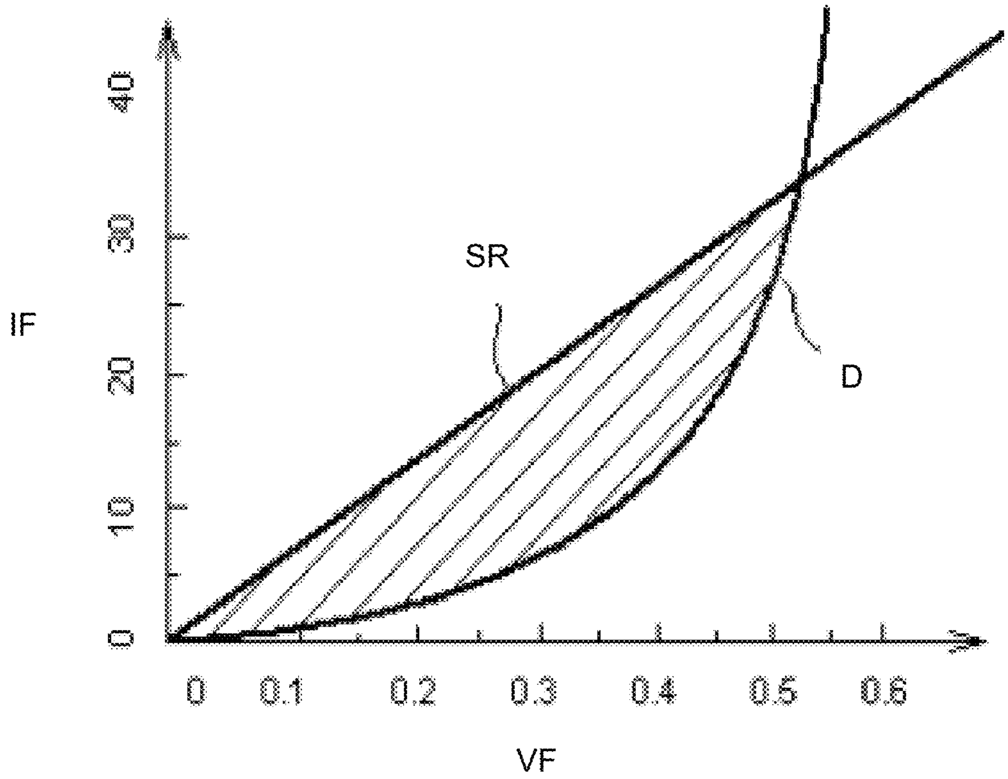
FIG.3 (Prior Art)
FIG. 3 shows an example current-voltage characteristic of switching converters with a non-synchronous rectifier as shown in FIG. 1 and a synchronous rectifier as shown in FIG. 2.
Figure 4:
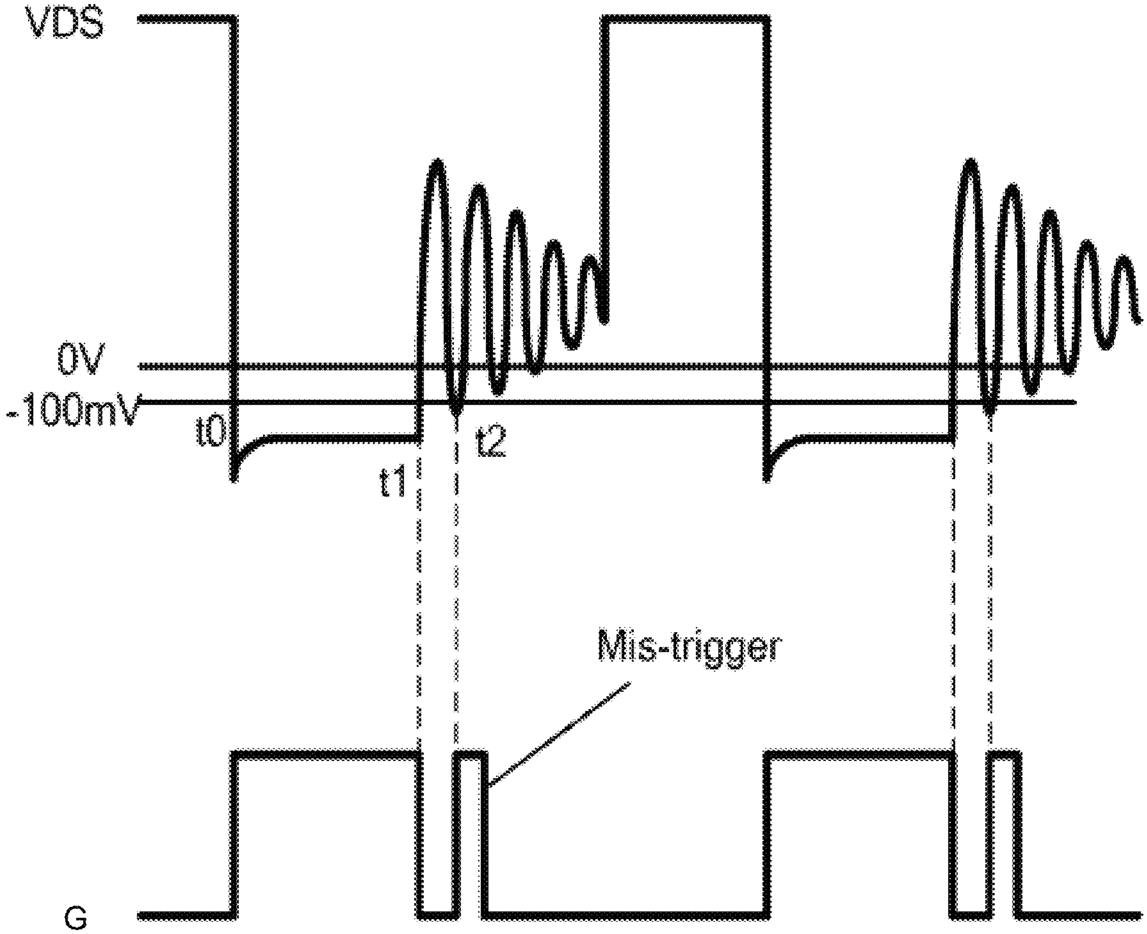
FIG.4 (Prior Art)
FIG. 4 schematically shows waveforms of a drain-source voltage and a control signal of a known synchronous rectifier of a synchronous flyback converter under DCM.
Figure 5:
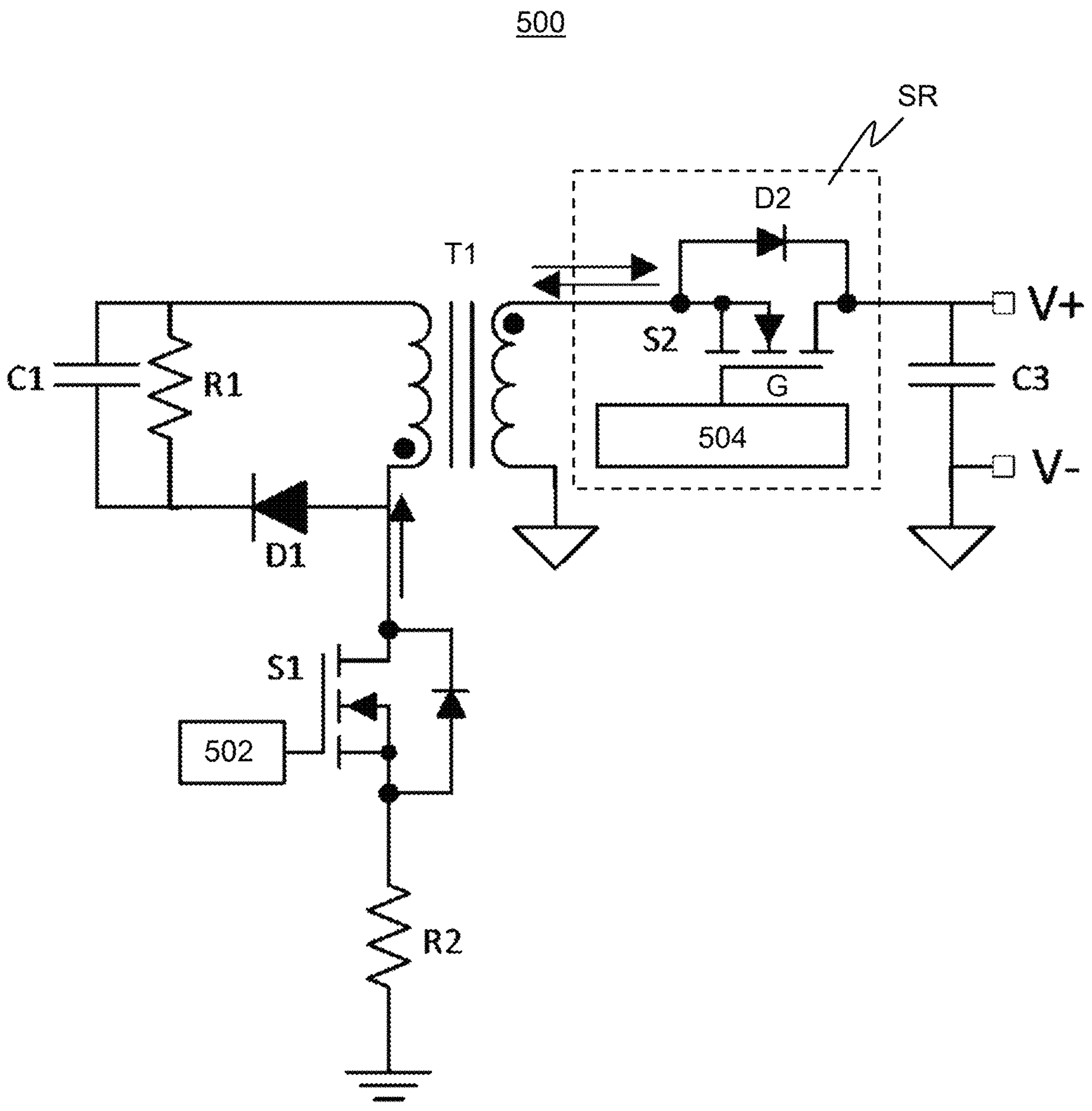
FIG. 5 schematically shows an example synchronous rectifying scheme of an example flyback converter.
Figure 6:
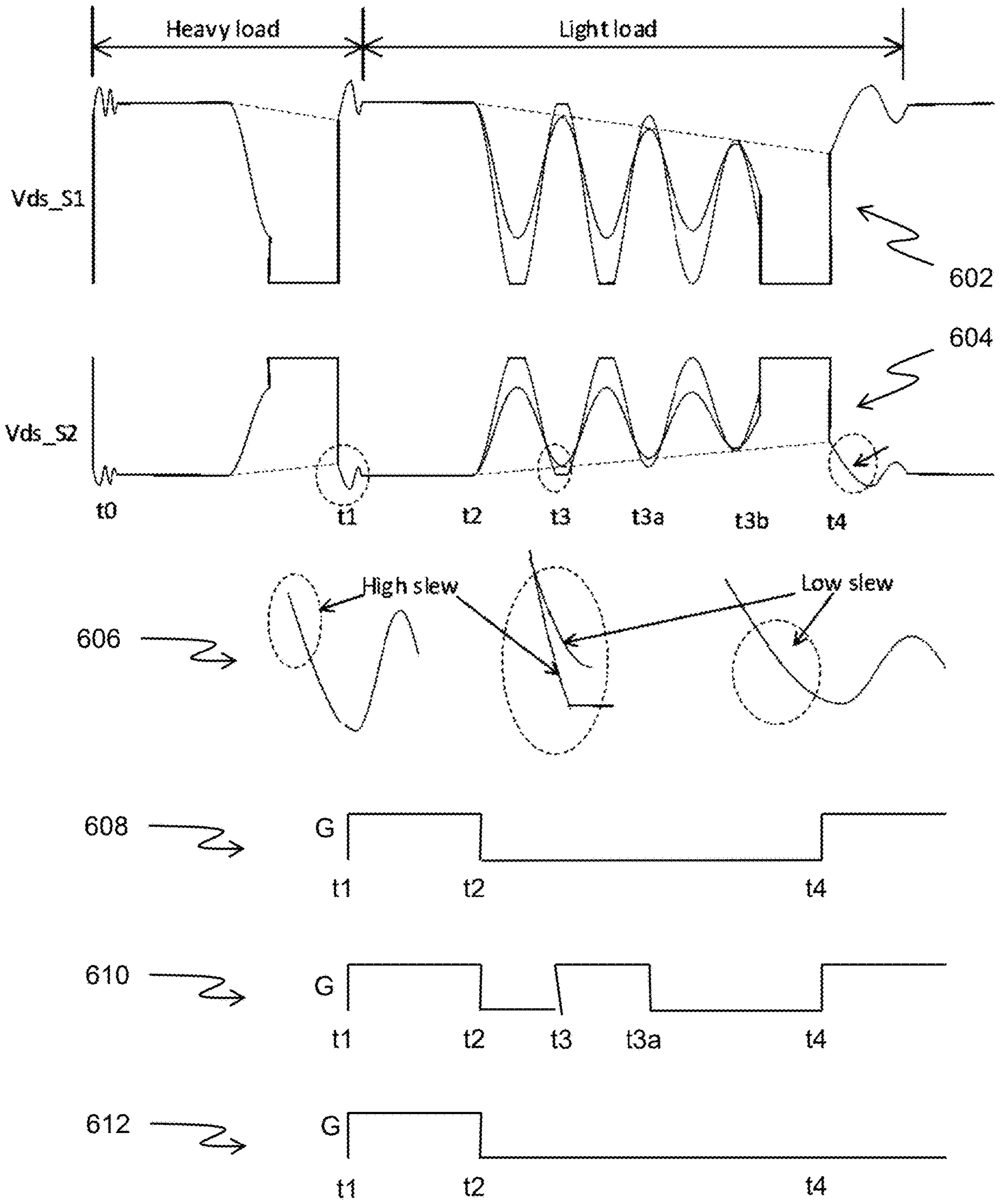
FIG. 6 shows example graphs of various voltage characteristics of the synchronous rectifying scheme of FIG. 5.

To better understand the concept of slew rate and mis-triggering, an example of a synchronous rectifying scheme 500 of a flyback converter and example voltage characteristics of this rectifying scheme are shown in FIG. 5 and FIG. 6, respectively. The rectifying scheme of FIG. 5 is similar to the rectifying scheme of FIG. 2, with the addition of switch controllers 502 and 504, and an energy-storing circuit including a diode D1, a resistor R1 and a capacitor C1 at the primary side of the transformer T1.

The synchronous rectifier scheme 500 includes a transformer T1. A primary switch S1 can be coupled to the primary winding of transformer T1. A primary switch S1, e.g., a FET, can be switched on and off under control of primary controller 502. The primary switch S1 can further be coupled to the energy-storing circuit. A synchronous rectifier SR can be coupled to the secondary winding of the transformer T1. A secondary switch S2, e.g., a FET, of the synchronous rectifier SR can be switched on and off via its gate G under control of secondary controller 504. FIG. 5 further shows a resistor R2, a capacitor C3, and output voltage pins V+ and V−.

The primary controller 502 and the secondary controller 504 can be connected to the gate of the primary switch S1 and gate G of the secondary switch S2, respectively, to control the on and off states of the switches S1 and S2. In the example of FIG. 5, the secondary controller 504 can be preconfigured to detect specific slew rates in the drain-source voltage Vds_S2 of the secondary switch S2, which slew rates can trigger the secondary controller 504 to switch the switch S2.

In FIG. 6, the drain-source voltage Vds_S1 of the first switch S1 and the drain-source voltage Vds_S2 of the second switch S2 are plotted in time as lines 602 and 604. In this example, between t0 and t1, the system is under heavy load, and between t1 and t4, the system is under light load. Parts of the graph 604 of Vds_S2 in the dotted circles at t1, t3, and t4 are shown zoomed-in below the graph as zoomed-in sections 606.

In the example of FIG. 6, under normal operation, from time t1 to t2 the primary switch S1 can turn on at t1. The high slew rate in Vds_S2 can then trigger the secondary controller 504 to turn on the secondary switch S2 of the synchronous rectifier SR, which is illustrated by graph 608, where the control signal at gate G of the secondary switch S2 becomes high at t1. Under normal operation, as long as Vds_S2 is at 0V, the control signal at gate G should remain high, thereby keeping the synchronous rectifier SR in the on state. At time t2, the transformer T1 can be demagnetized, and Vds_S2 starts rising because of declining Vds_S1, and as a result, the secondary switch S2 can be turned off. The secondary switch S2 can be kept off during the DCM ringing period between t2 and t3*b*, when the voltage declined slew rate is slower than the slew setting of the secondary controller 504. In the example of FIG. 6, at time t3*b*, the Vds_S2 signal 604 stabilizes (the DCM ringing stops), and the secondary switch S2 is kept in the off state. At time t4, a low slew rate can be detected by the secondary controller 504, triggering the control signal at gate G to become high, thereby turning on the secondary switch S2.

In known secondary controllers 504, the slew rate settings triggering the control signals at gate G of the secondary switch S2 have fixed values. Under the light load condition, the amplitude of the DCM ringing in Vds_S1 caused, e.g., by magnetic inductance and output capacitance (Coss) of the primary switch S1 can increase significantly after the secondary switch S2 turns off, in the example of FIG. 6 at t2, which can result in Vds_S2 also becoming strongly resonant. As a result, the waveform of Vds_S2 can change from the original sine wave to an approximate trapezoidal wave, which is shown in graph 604 as the second clipped line on top of the sine waveform. In the example of FIG. 6, as a result, the slope of Vds_S2 at the time of zero-crossing t3 can significantly increase, which is illustrated in zoomed-in graph 606 by the high slew below the low slew at t3.

If the detected slew rate is faster than the internal setting of the secondary controller 504, the high slew at t3 can mis-trigger the secondary controller 504, resulting in the secondary switch S2 being incorrectly switched. This is illustrated in graph 610, where the gate signal at gate G becomes high at t3, where it should remain low, as illustrated in graph 608.

Another example of mis-triggering can occur at t4. Leakage inductance and Coss of the primary switch S1 can resonate when S1 is turned off at t1. The slew rate of Vds_S2 at t4 (under light load) can be much lower than the slew rate of Vds_S2 at t1 (under heavy load). As a result, the secondary switch S2 cannot be triggered if the detected slew rate is slower than the internal setting of the secondary controller 504. This is illustrated in graph 612, where the gate signal G remains low at t4, where it should become high, as illustrated in graph 608.

If the setting slew rate is too fast, the secondary switch S2 cannot be mis-triggered during DCM ringing, but the secondary switch S2 typically can't be conducted under most of the load conditions. On the other hand, if the setting slew rate is too low, the secondary switch S2 can be conducted even at light load but can be mis-triggered during the DCM ringing. As a result, with a fixed slew rate setting, it can be difficult to turn on the secondary switch S2 correctly while preventing the secondary switch S2 from being mis triggered during DCM ringing.

The present disclosure presents a solution to the above-identified drawbacks of known synchronous flyback converters and, in particular, presents an adaptive slew rate setting/detection at the secondary controller of the synchronous rectifier SR. Hereto, the secondary controller 504 can be adapted to detect a time off period of the secondary switch S2 and adapt the slew rate setting accordingly. E.g., the longer the secondary switch S2 is off (the control signal at gate G can then be low), the lower the slew rate setting. In the example of FIG. 6, the slew rate setting at t4 can be dynamically set lower than the slew rate setting at t3*b*, which can be dynamically set lower than the slew rate setting at t3*a*, which can be dynamically set lower than the slew rate setting at t3. In this example, the slew rate setting at t3 can thus be the fastest, so to prevent the secondary switch S2 from mis-triggering during DCM ringing. In this example, the slew rate setting at t4 can thus be slowest, so the secondary switch S2 can be conducted even under light load conditions.

Figure 7:
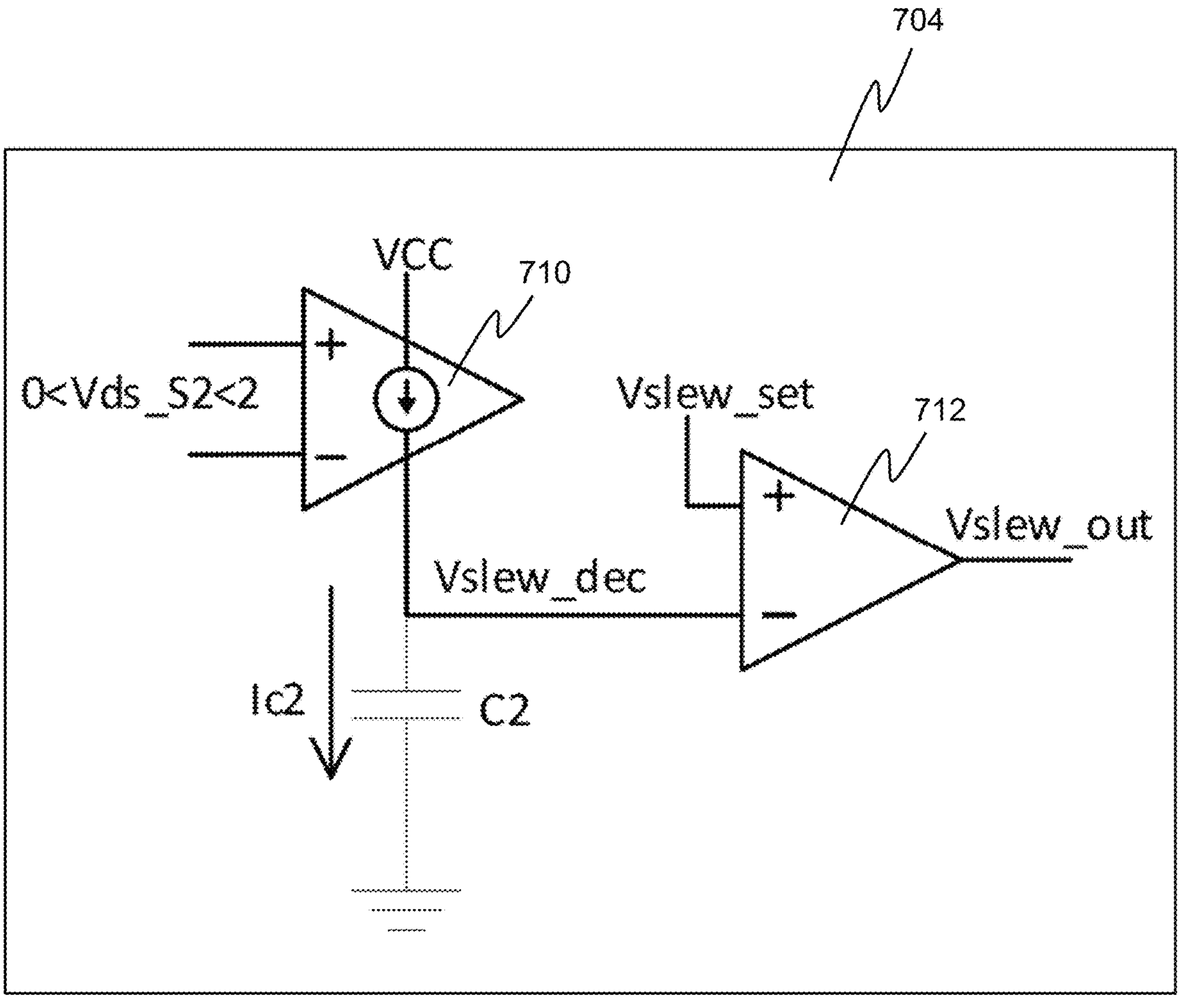
FIG. 7 schematically shows a secondary controller of an example embodiment of the present disclosure.

FIG. 7 shows an example embodiment of an improved secondary controller 704, which can replace the secondary controller 504 of FIG. 5. Only parts of the controller 704 involved in the adaptive slew rate setting and detection are shown in FIG. 7. Other not-shown parts can be implemented in a manner known per se, e.g., similar to any known secondary controller.

In FIG. 7, a detector 710, e.g., implemented using a comparator, can detect a current slew rate in the Vds_S2 signal. Output of the detector 710 can be a voltage indicative of the degree of decrementing of the Vds_S2, in FIG. 7 depicted as Vslew_dec, thus indicative of the detected slew rate. Note that in the example of FIG. 7*a* capacitor C2 induces a current Ic2.

The detected slew rate Vslew_dec can be compared with an adaptive slew rate setting Vslew_set by a comparator 712, which adaptive slew rate setting Vslew_set can be determined by an adaptive slew rate circuit, examples of which will be explained in FIGS. 8-11. In the example of FIG. 7, the detected slew rate Vslew_dec can be input to the negative input of the comparator 712, and the adaptive slew rate setting Vslew_set can be input to the positive input of the comparator 712. Output of the comparator 712 is a trigger signal Vslew_out that can be or can be used to generate the control signal that triggers the switching of gate G of the secondary switch S2.

FIG. 7 is to be understood as a non-limiting example. Other components or configurations can be used instead of the detector 710, i.e., detection of the current slew rate in the Vds_S2 signal can be performed in any manner known per se, e.g., as performed by a known secondary controller 504 using fixed slew rate settings. Other components or configurations can be used instead of the comparator 712 to compare the detected slew rate Vslew_dec and the adaptive slew rate setting Vslew_set, and generate the trigger signal Vslew_out.

Figure 8:
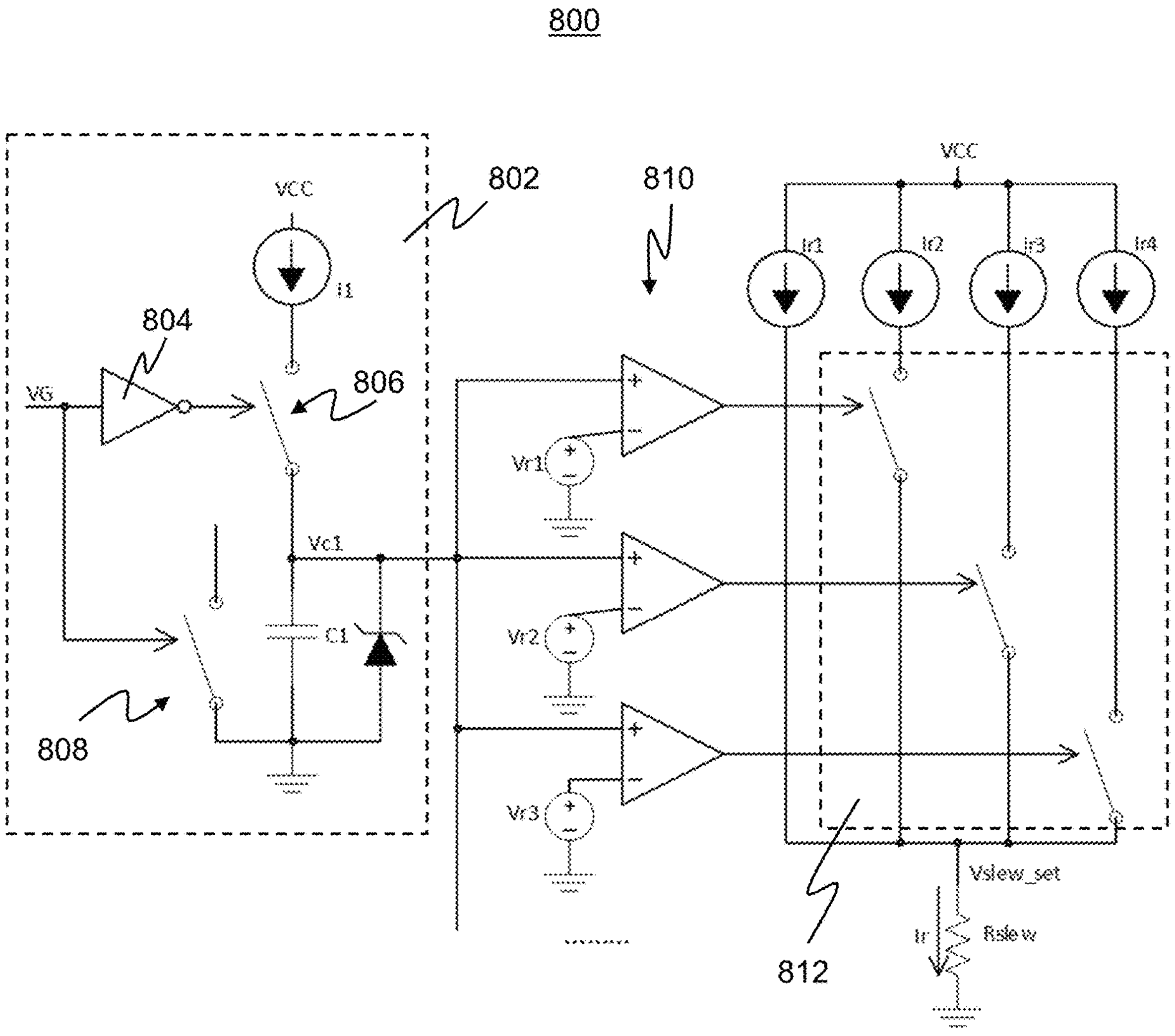
FIG. 8 and FIG. 10 schematically show different implementations of dynamic slew rate detection circuits of a secondary controller of exemplary embodiments of the present disclosure.
Figure 9:
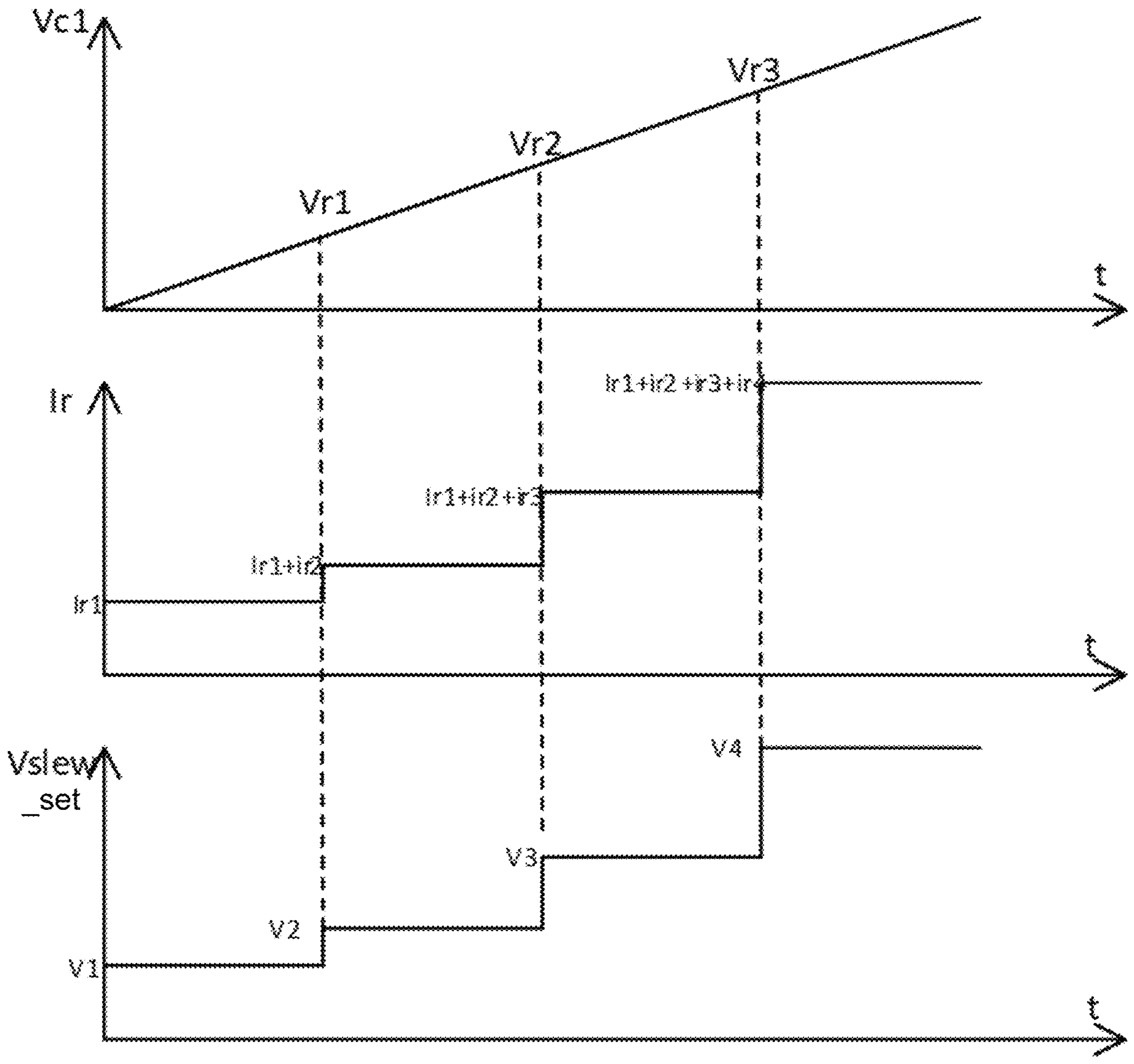
FIG. 9 and FIG. 11 show example graphs of voltage and current characteristics of the dynamic slew rate detection circuits of FIG. 8 and FIG. 10, respectively.
Figure 10:
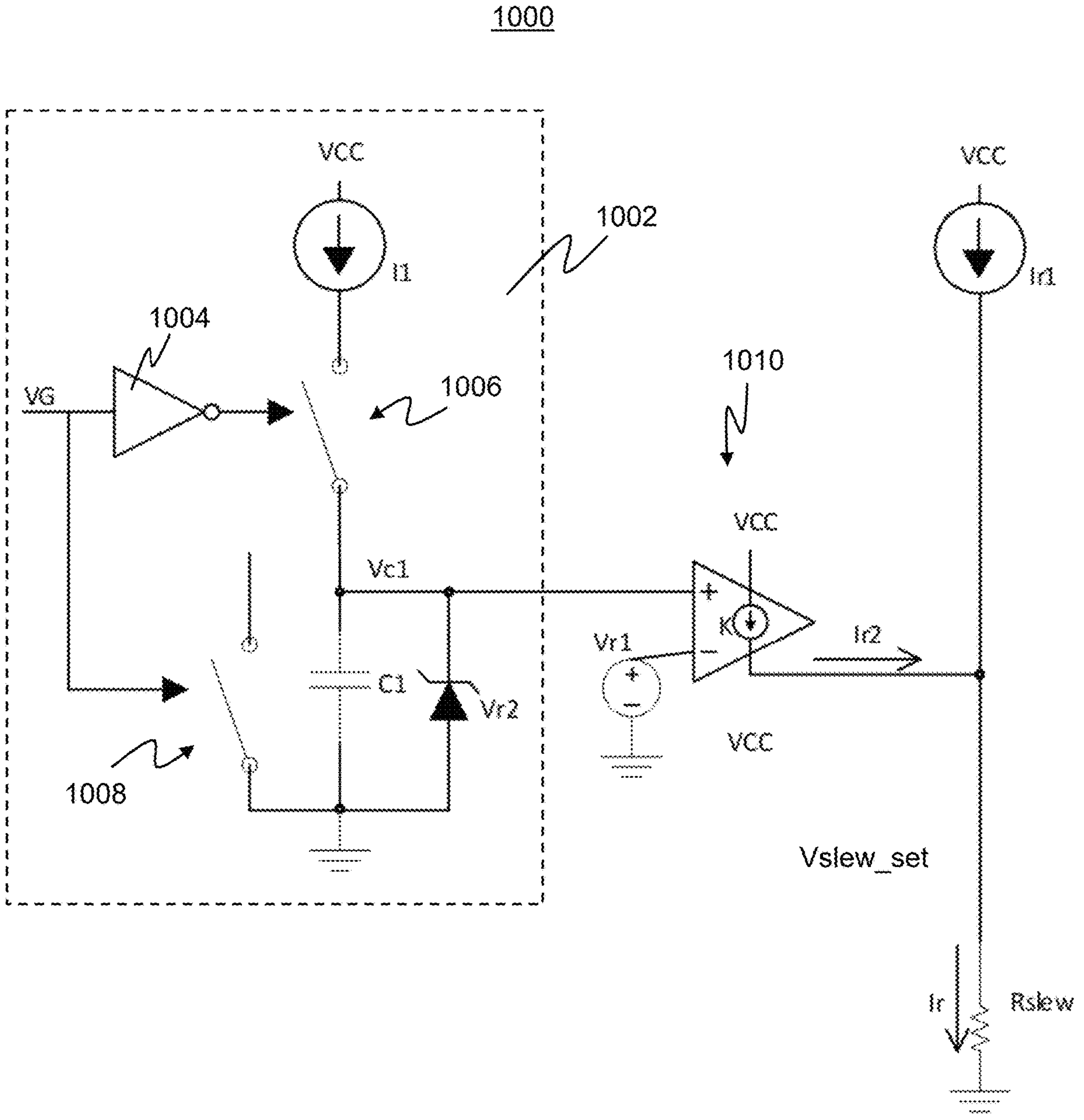
Figure 11:
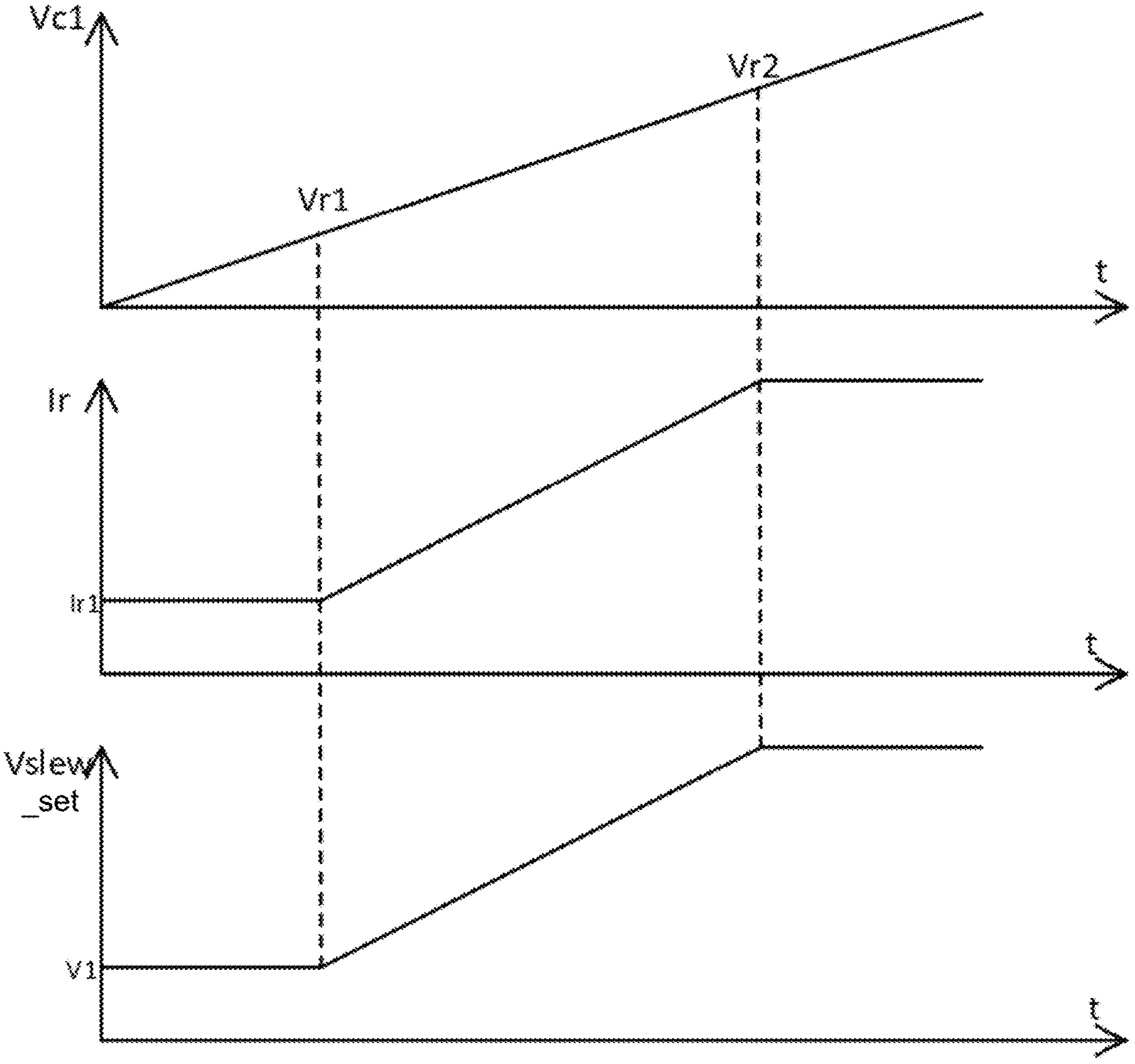

FIG. 8 and FIG. 10 show block diagrams of example embodiments of adaptive slew rate circuits 800, 1000 for determining the adaptive slew rate setting Vslew_set. The adaptive slew rate circuit 800, 1000 is typically part of the secondary controller 704. In the example embodiment of FIG. 8, the adaptive slew rate setting can be in a step mode, resulting in a slew rate setting Vslew_set as shown in the example of FIG. 9. In the example of FIG. 10, the adaptive slew rate setting can be in a continuous mode, resulting in a slew rate setting Vslew_set as shown in the example of FIG. 11.

The slew rate detection circuit, such as the circuit 800 or 1000, is typically active when the secondary switch S2 is closed, i.e., when the control signal to gate G of the secondary switch S2 is low. In the example of FIG. 6, this corresponds to the period prior to t1 and the period between t2 and t4, where the slew rate is used to trigger turning on the secondary switch S2.

The closed state of the secondary switch S2 can be detected by a gate state detection circuit 802, 1002, such as shown in the examples of FIG. 8 and FIG. 10. When the control signal at gate G is low, the gate voltage VG can be low, resulting in the invertor 804, 1004 generating a high signal closing the switch 806, 1006. The slew rate detection circuit 800, 1000 can then be connected to the voltage source VCC. The other switch 808, 1008 of the gate state detection circuit 802, 1002 can then be opened.

Similarly, the opened state of the secondary switch S2 can be detected by the gate state detection circuit 802, 1002. When the control signal at gate G is high, the gate voltage VG can be high, resulting in the invertor 804, 1004 generating a low signal opening the switch 806, 1006. The slew rate detection circuit 800, 1000 can then be disconnected from the voltage source VCC. The other switch 808, 1008 of the gate state detection circuit 802, 1002 can then be closed.

When the secondary switch S2 is closed, i.e., VG is low, switch 806/1006 is closed and switch 808/1008 is opened, the capacitor C1 is charged by the current I1. As a result, the longer the off time of the secondary switch S2, the higher the voltage at Vc1.

In the example of FIG. 8, the slew rate detection circuit 800 includes a plurality of current selectors 810, each controlling a switch 812 for including a current source into the circuit 800. The current flow through slew rate resistor Rslew, depicted as slew rate current Ir, can generate the adaptive slew rate setting voltage Vslew_set, used by the secondary controller 704, such as shown in FIG. 7.

In the example of FIG. 8, the slew rate resistor Rslew can be charged by base current Ir1 at the beginning. If Vc1 is higher than Vr1, the current selector 810 at Vr1 can close the corresponding switch 812, and the current Ir2 can be added to Ir. If Vc1 is higher than Vr2, the current selector 810 at Vr2 can close its corresponding switch 812, and the current Ir3 can be added to Ir. If Vc1 is higher than Vr3, the current selector 810 at Vr3 can close its corresponding switch 812, and the current Ir4 can be added to Ir. There can be any number of step-up converts 810 to add current in steps to Ir, depending on implementation requirements.

FIG. 9 shows an example of stepping up of the current Ir as a result of adding current sources to the circuit by the current selectors 810. The top graph shows levels of voltage Vc1 in time. When Vc1 reaches Vr1, the current source Ir2 can be added to the circuit, resulting in the step-up of the current from Ir to Ir+Ir2, as shown in the middle graph of FIG. 9. When Vc1 reaches Vr2, the current source Ir3 can be added to the circuit, resulting in the further step-up of the current from Ir+Ir2 to Ir+Ir2+Ir3. When Vc1 reaches Vr3, the current source Ir4 can be added to the circuit, resulting in the further step-up of the current from Ir+Ir2+Ir3 to Ir+Ir2+Ir3+Ir4. Corresponding slew rate setting voltages Vslew_set are shown in the bottom graph of FIG. 9.

In the example of FIG. 10, the slew rate detection circuit 1000 includes a current selector 1010 for continuously increasing an output current Ir2 depending on the voltage Vc1. The current flow through slew rate resistor Rslew, depicted as slew rate current Ir, can generate the adaptive slew rate setting voltage Vslew_set, used by the secondary controller 704, such as shown in FIG. 7.

In the example of FIG. 10, the slew rate resistor Rslew can be charged by first current source Ir1 increased with the current I2 from the current selector 1010. For example, current Ir2 can be set to zero when Vc1<Vr1 and set to (Vc1−Vr1)*K when Vr1<Vc1<Vr2.

FIG. 11 shows an example of continuously increasing the current Ir as a result of adding current Ir2 to the circuit by the current selector 1010. The top graph shows levels of voltage Vc1 in time. When Vc1 reaches Vr1, the current Ir2 can be added to the circuit, which current I2 continuously increases until Vc1 reaches Vr2. Corresponding slew rate setting voltages Vslew_set are shown in the bottom graph of FIG. 11.

With reference to FIG. 7, the higher Vslew_set, such as determined by the slew rate detection circuit 800 or 1000, the longer the charge time of C2 to the voltage level of Vslew_set, and thus the slower the slew rate Vslew_out. In the example of FIG. 7, the slew rate Vslew_out can be determined as 2V (i.e., the maximum value of Vds_S2 in the example of FIG. 7) divided by the charge time of C2.

The present application can advantageously be used in quick chargers and power adapters.

What is claimed is:

1. A controller of a synchronous rectifier having a switch that is switchable by the controller, the controller comprising:
   an adaptive slew rate detection circuit,
   wherein the adaptive slew rate detection circuit is configured to add a current to a base slew rate current depending on an off-time of the switch to obtain a slew rate current,
   wherein the slew rate current determines a slew rate setting voltage, and
   wherein the controller is configured to turn on the switch depending on the slew rate setting voltage.

2. The controller according to claim 1, further comprising:
   a gate state detection circuit configured to detect an off-state of the switch,
   wherein the adaptive slew rate detection circuit is further configured to add the current to the base slew rate current when the switch is in the off-state.

3. The controller according to claim 1,
   wherein the adaptive slew rate detection circuit comprises a plurality of current selectors,
   wherein each current selector of the plurality of current selectors is configured to detect different off-times of the switch based on a voltage generated as a result of charging characteristics of a capacitor during the off-time of the switch, and
   wherein each current selector of the plurality of current selectors is configured to include a different current source to the adaptive slew rate detection circuit to add a respective current to the base slew rate current.

4. The controller according to claim 2,
   wherein the adaptive slew rate detection circuit comprises a plurality of current selectors,
   wherein each current selector of the plurality of current selectors is configured to detect different off-times of the switch based on a voltage generated as a result of charging characteristics of a capacitor during the off-time of the switch, and
   wherein each current selector of the plurality of current selectors is configured to include a different current source to the adaptive slew rate detection circuit to add a respective current to the base slew rate current.

5. The controller according to claim 4, wherein each current selector of the plurality of current selectors is configured to switch a current switch to include the respective current source into the slew rate detection circuit.

6. The controller according to claim 1,
   wherein the adaptive slew rate detection circuit comprises a current selector, and
   wherein the current selector is configured to increasingly add the current depending on the off-time of the switch based on a voltage generated as a result of charging characteristics of a capacitor during the off-time of the switch.

7. The controller according to claim 2,
   wherein the adaptive slew rate detection circuit comprises a current selector, and
   wherein each current selector of the plurality of current selectors is configured to increasingly add the current depending on the off-time of the switch based on a voltage generated as a result of charging characteristics of a capacitor during the off-time of the switch.

8. The controller according to claim 1, wherein the synchronous rectifier is configured to operate in a discontinuous current mode.

9. The controller according to claim 2, wherein the synchronous rectifier is configured to operate in a discontinuous current mode.

10. The controller according to claim 1, wherein the switch comprises a field-effect transistor.

11. The controller according to claim 2, wherein the switch comprises a field-effect transistor.

12. A synchronous flyback converter comprising:
   a transformer having a primary winding and a secondary winding;
   a primary switch coupled to the primary winding of the transformer; and
   a synchronous rectifier coupled to the secondary winding of the transformer,
   wherein the synchronous rectifier comprises a secondary switch that is switchable under control of a controller,
   wherein the controller comprises an adaptive slew rate detection circuit,
   wherein the adaptive slew rate detection circuit is configured to add a current to a base slew rate current depending on an off-time of the secondary switch to obtain a slew rate current,
   wherein the slew rate current determines a slew rate setting voltage, and
   wherein the controller is configured to turn on the secondary switch depending on the slew rate setting voltage.

13. The synchronous flyback converter according to claim 12, wherein the controller further comprises:
   a gate state detection circuit configured to detect an off-state of the secondary switch,
   wherein the adaptive slew rate detection circuit is further configured to add the current to the base slew rate current when the secondary switch is in the off-state.

14. The synchronous flyback converter according to claim 13,
   wherein the adaptive slew rate detection circuit comprises a plurality of current selectors,
   wherein each current selector of the plurality of current selectors is configured to detect different off-times of the secondary switch based on a voltage generated as a result of charging characteristics of a capacitor during the off-time of the secondary switch, and
   wherein each current selector of the plurality of current selectors is configured to include a different current source to the adaptive slew rate detection circuit to add a respective current to the base slew rate current.

15. The synchronous flyback converter according to claim 14, wherein each current selector of the plurality of current selectors is configured to switch a current switch to include the respective current source into the slew rate detection circuit.

16. A switching power supply comprising:
   a synchronous flyback converter,
   wherein the synchronous flyback converter comprises: a transformer having a primary winding and a secondary winding, a primary switch coupled to the primary winding of the transformer, and a synchronous rectifier coupled to the secondary winding of the transformer,
   wherein the synchronous rectifier comprises a secondary switch that is switchable under control of a controller,
   wherein the controller comprises an adaptive slew rate detection circuit,
   wherein the adaptive slew rate detection circuit is configured to add a current to a base slew rate current depending on an off-time of the switch to obtain a slew rate current, wherein the slew rate current determines a slew rate setting voltage, and wherein the controller is configured to turn on the switch depending on the slew rate setting voltage.

17. The switching power supply according to claim 16, wherein the controller further comprises:

a gate state detection circuit configured to detect an off-state of the secondary switch, wherein the adaptive slew rate detection circuit is further configured to add the current to the base slew rate current when the secondary switch is in the off-state.

18. The switching power supply according to claim 17, wherein the adaptive slew rate detection circuit comprises a plurality of current selectors, wherein each current selector of the plurality of current selectors is configured to detect different off-times of the switch based on a voltage generated as a result of charging characteristics of a capacitor during the off-time of the switch, and wherein each current selector of the plurality of current selectors is configured to include a different current source to the adaptive slew rate detection circuit to add a respective current to the base slew rate current.

19. The switching power supply according to claim 18, wherein each current selector of the plurality of current selectors is configured to switch a current switch to include the respective current source into the slew rate detection circuit.

* * * * *